US010163489B2

(12) United States Patent
Chen et al.

(10) Patent No.: US 10,163,489 B2
(45) Date of Patent: *Dec. 25, 2018

(54) 3D STRUCTURE FOR ADVANCED SRAM DESIGN TO AVOID HALF-SELECTED ISSUE

(71) Applicant: Taiwan Semiconductor Manufacturing Company, Ltd., Hsinchu (TW)

(72) Inventors: Chien-Yuan Chen, Hsinchu (TW); Chien-Yu Huang, Zhongli (TW); Hau-Tai Shieh, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/865,923

(22) Filed: Jan. 9, 2018

(65) Prior Publication Data

US 2018/0130519 A1 May 10, 2018

Related U.S. Application Data

(63) Continuation of application No. 14/087,029, filed on Nov. 22, 2013, now Pat. No. 9,875,789.

(51) Int. Cl.
*G11C 11/418* (2006.01)
*G11C 5/02* (2006.01)
(Continued)

(52) U.S. Cl.
CPC ............ *G11C 11/418* (2013.01); *G11C 5/025* (2013.01); *G11C 8/08* (2013.01); *H01L 25/0657* (2013.01);
(Continued)

(58) Field of Classification Search
None
See application file for complete search history.

(56) References Cited

U.S. PATENT DOCUMENTS 4,150,441 A * 4/1979 Ando ................... G11C 11/417
365/182
6,643,159 B2 11/2003 Fricke et al.
(Continued)

FOREIGN PATENT DOCUMENTS

EP 0073486 A2 3/1983

*Primary Examiner* — Douglas King
(74) *Attorney, Agent, or Firm* — Slater Matsil, LLP (57) ABSTRACT

Systems are provided for a three dimension static random access memory (SRAM) structure. The SRAM structure comprises a plurality of memory array layers, layer decoder circuitry on each memory array layer, a word line driver circuit disposed on each memory array layer, and a plurality of complementary bit line pairs extending vertically from a memory cell in a first memory array layer to a memory cell in a second memory array layer. The layer decoder circuitry on each memory array layer is configured to decode a portion of an SRAM address to determine if the SRAM address corresponds to memory cells on its memory array layer. The word line driver circuit disposed on each memory array layer is configured to operate cooperatively with a partial SRAM address decoder to select and drive one of the plurality of word lines disposed on its memory array layer, wherein a selected word line is connected to a predetermined number of memory cells in a specific memory array layer.

20 Claims, 6 Drawing Sheets

(51) Int. Cl.
  *G11C 8/08*   (2006.01)
  *H01L 25/065*   (2006.01)
  *G11C 11/412*   (2006.01)
  *H01L 27/11*   (2006.01)

(52) U.S. Cl.
  CPC ......... *G11C 11/412* (2013.01); *H01L 27/1104* (2013.01); *H01L 2924/0002* (2013.01)

(56) References Cited

U.S. PATENT DOCUMENTS

| | | |
|---|---|---|
| 6,906,940 B1 | 6/2005 | Lue |
| 8,964,452 B2 | 2/2015 | Su et al. |
| 2001/0015916 A1 | 8/2001 | Huang |
| 2004/0001348 A1 | 1/2004 | Vyvoda et al. |
| 2006/0262610 A1 | 11/2006 | Khellah et al. |
| 2008/0055967 A1 | 3/2008 | Houston et al. |
| 2010/0061171 A1 | 3/2010 | Kim et al. |
| 2010/0195362 A1 | 8/2010 | Norman |
| 2013/0094273 A1 | 4/2013 | Chien et al. |

* cited by examiner

3D STRUCTURE FOR ADVANCED SRAM DESIGN TO AVOID HALF-SELECTED ISSUE

CROSS-REFERENCE TO RELATED APPLICATIONS

This application is a continuation of U.S. application Ser. No. 14/087,029, filed on Nov. 22, 2013, entitled "Novel 3D Structure for Advanced SRAM Design to Avoid Half-Selected Issue", which application is hereby incorporated herein by reference.

FIELD

The technology described in this patent document relates generally to SRAM devices and more particularly to a SRAM device structure having multiple semiconductor device layers that can avoid the half-selected issue with SRAM memory cells.

BACKGROUND

Static random access memory (SRAM) is commonly used in electronic devices. SRAM cells have the advantageous feature of holding data without a need for refreshing. SRAM cells may include different numbers of transistors, and are often accordingly referred to by the number of transistors, for example, six-transistor (6 T) SRAM, eight-transistor (8 T) SRAM, and the like. The transistors typically form a data latch for storing a data bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line (or a pair of bit-lines), which is used for storing a data bit into a selected SRAM cell or reading a stored data bit from the selected SRAM cell.

SUMMARY

In accordance with the teachings described herein, systems and methods are provided for a three dimensional static random access memory (SRAM) structure having multiple semiconductor-device layers. In one example, provided is a SRAM structure comprising a plurality of memory array layers, layer decoder circuitry on each memory array layer, a word line driver circuit disposed on each memory array layer, and a plurality of complementary bit line pairs extending vertically from a memory cell in a first memory array layer to a memory cell in a second memory array layer. The memory array layers comprise at least a first memory array layer and a second memory array layer vertically disposed above the first memory array layer. Each memory array layer comprises a plurality of memory cells. The layer decoder circuitry on each memory array layer comprises a first layer decoder circuit on the first memory array layer and a second layer decoder circuit on the second memory array layer. Each of the first layer decoder circuit and the second layer decoder circuit is configured to decode a portion of an SRAM address to determine if the SRAM address corresponds to memory cells on its memory array layer. The word line driver circuit disposed on each memory array layer is configured to operate cooperatively with a partial SRAM address decoder to select and drive one of the plurality of word lines disposed on its memory array layer, wherein a selected word line is connected to a predetermined number of memory cells in a specific memory array layer.

In another example, provided is a SRAM structure comprising a plurality of memory array layers vertically disposed one above another, a layer decoder circuit on each memory array layer, a word line driver configured to operate cooperatively with a partial SRAM address decoder and one of the layer decoder circuits to select and drive one of the plurality of word lines disposed on one of the memory array layers, and a plurality of complementary bit line pairs, each complementary bit line pair extending vertically to couple to a memory cell in each memory array layer. Each memory array layer comprises a plurality of memory cells and a plurality of word lines disposed thereon. Each word line is connected to a predetermined number of the memory cells in a specific memory array layer. Each layer decoder circuit is configured to decode a portion of an SRAM address to determine if the SRAM address corresponds to memory cells on its memory array layer. The SRAM device is configured to activate only the word line connected to those memory cells selected by the SRAM address so that a read or write operation does not result in a non-selected memory cell consuming unnecessary power.

In another example, a method in a SRAM is provided comprising providing a plurality of memory array layers vertically disposed one above another. Each memory array layer comprises a plurality of memory cells. Each memory array layer further comprises an x-decoder and a layer decoder. The layer decoder is configured to decode a portion of an SRAM address to determine the memory array layer on which the memory cells addressed by the SRAM address are disposed. The method further comprises providing a plurality of word lines disposed on each memory array layer, wherein each word line is connected to a predetermined number of the memory cells in a specific memory array layer in a row direction. The method additionally comprises providing a plurality of complementary bit line pairs, each complementary bit line pair extending vertically to couple to a memory cell in each memory array layer. In addition, the predetermined number of memory cells that the word lines connect is equal to the number of input/output cells in the device.

DETAILED DESCRIPTION

In advanced SRAM designs, it is desirable to use memory cells having small dimensions that operate on low power sources, and operate at high clock rates. As the memory cell density in memory arrays increase, memory arrays may be split into smaller sub-arrays due at least in part to a desire to reduce the length of bit lines. Splitting memory arrays into sub-arrays also results in additional SRAM management circuitry such as additional local input/output (I/O) circuitry and other local control circuitry. This can result in increased surface area on a die taken upon by the additional SRAM management circuitry. Also, in some designs to speed operation, memory arrays are divided up into banks and each bank decodes a portion of an SRAM address applied for a read operation or a write operation and activates the word lines of memory cells sharing the portion of the decoded address. A multiplexer would select the memory cells to be used for the memory operation. This can result in unnecessary power usage. For example, in a SRAM device having four memory banks, four word lines may be activated but the bit lines connected to memory cells on only one of the four word lines may be used. The memory cells connected to the other three activated word lines may consume unnecessary power.

Figure 1:
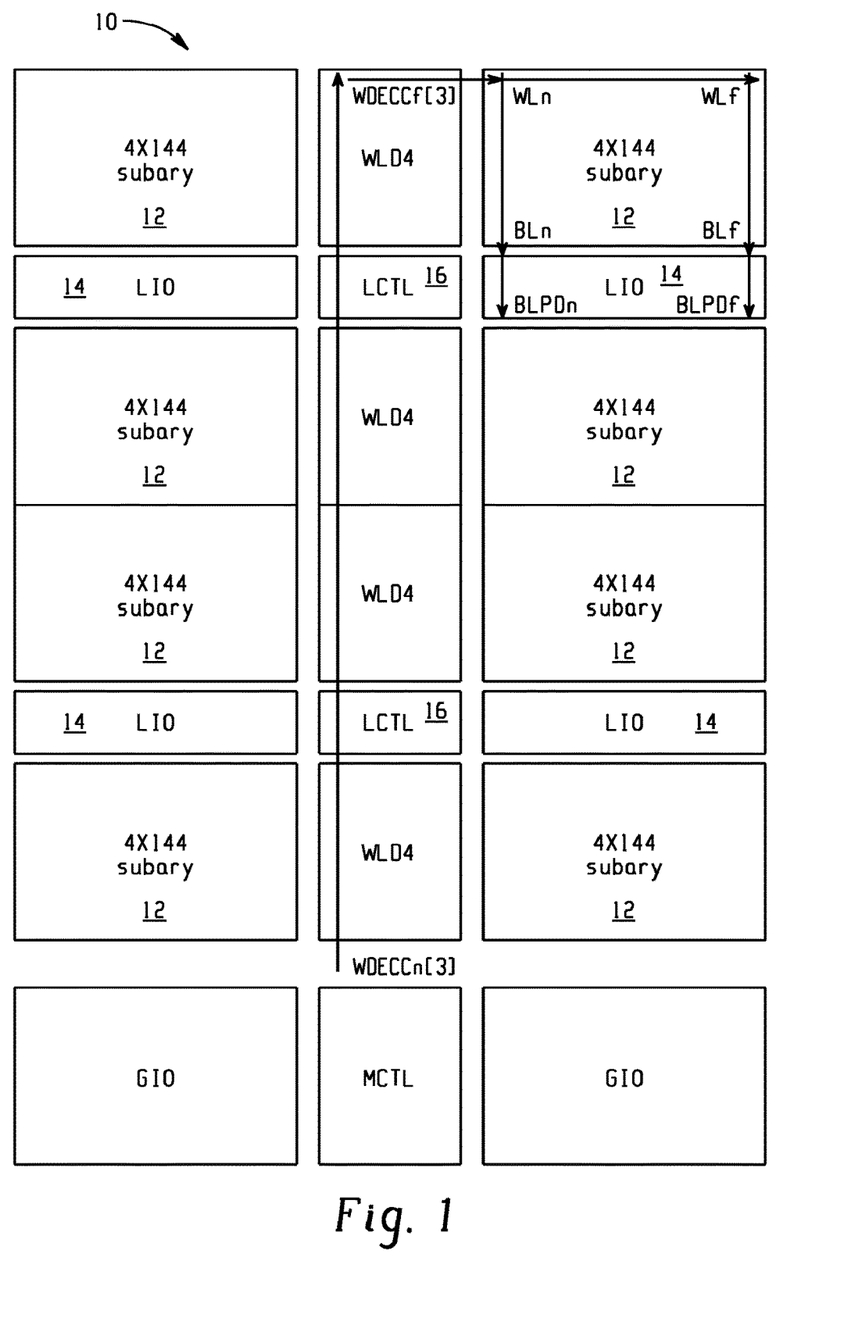
FIG. 1 is a block diagram of an example two dimension (2D) static random access memory (SRAM) structure.

Depicted in FIG. 1 is a block diagram of an example two dimension (2D) static random access memory (SRAM) structure 10. The example SRAM structure 10 is for a 64×288M4 SRAM. To shorten the bit lines, the memory array has been subdivided into four banks containing a total of 8 sub-arrays 12. Because the array has been divided into 8 sub-arrays, additional SRAM management circuits such as local I/O circuits (LIO) 14 and local control circuits (LCTL) 16 are supplied which results in the usage of additional surface area. 1152 bit lines are provided in this design. But only 288 bit lines are effective during a memory read or write operation. Consequently, dummy read behavior can occur with memory cells coupled to the remaining 864 bit lines. Dummy read behavior can result in unnecessary power consumption.

Figure 2:
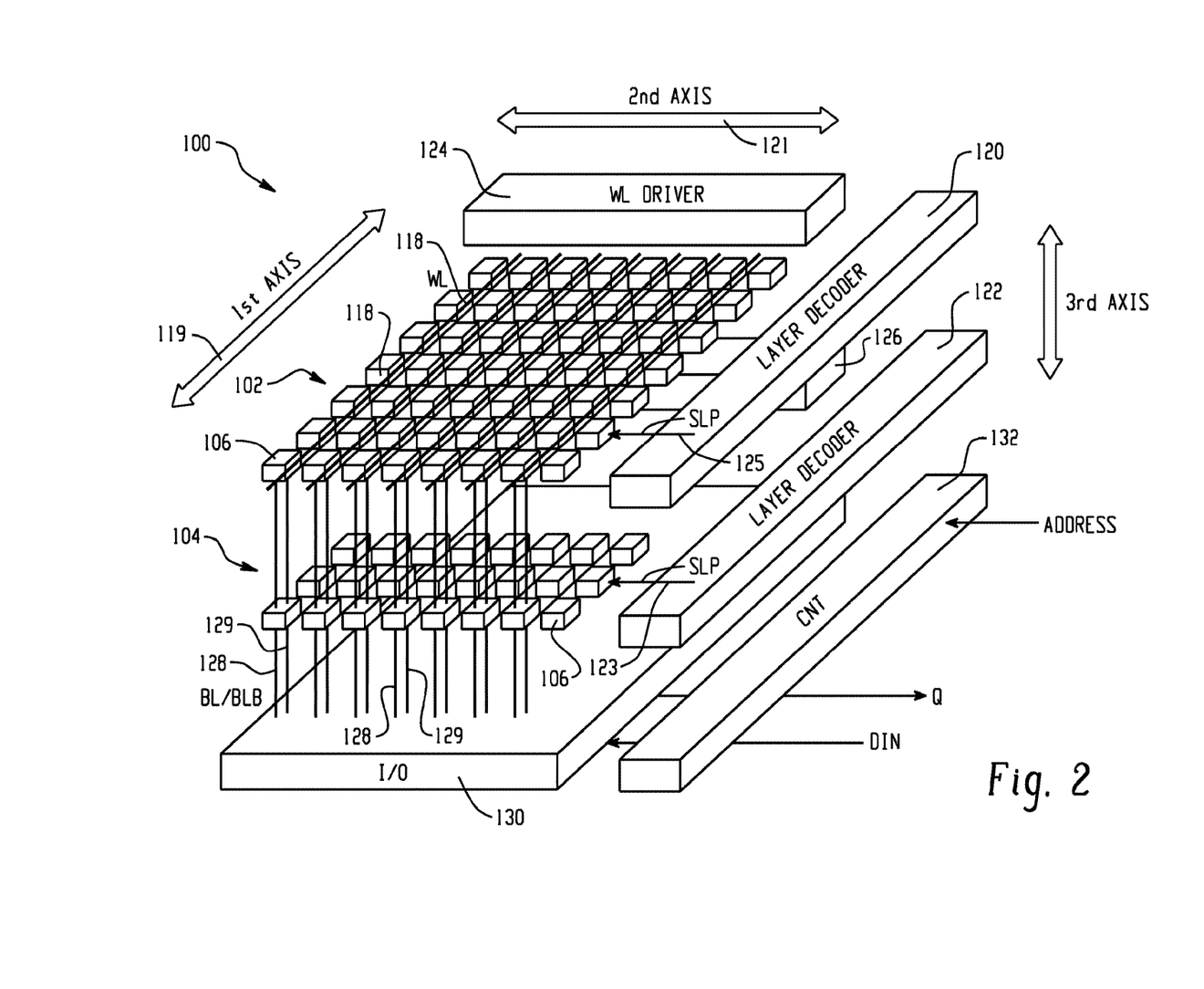
FIG. 2 is a block diagram of an example three dimension (3D) static random access memory (SRAM) structure.

Depicted in FIG. 2 is a block diagram of an example three dimension (3D) static random access memory (SRAM) structure. In many embodiments, greater surface area efficiency may be achieved using a 3D structure instead of a 2D structure. The example 3D SRAM structure 100 includes a plurality of memory array layers 102, 104 vertically disposed one above another. In this example two memory array layers 102, 104 are shown, but the 3D SRAM structure 100 may include additional memory array layers. The number of memory array layers can be set to be equal to the number of multiplexers in the SRAM structure.

Each memory array layer comprises a plurality of SRAM memory cells 106. The memory cells are for storing bits of data to be written to the SRAM or for outputting bits of data to be read from the SRAM. Multiple types of memory cells can be used.

Figure 3A:
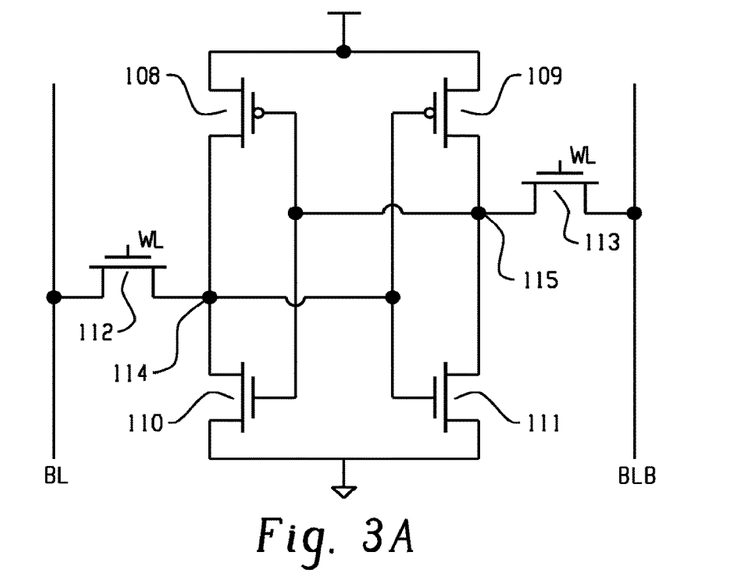
FIGS. 3A and 3B are schematic diagrams of example SRAM memory cells.
Figure 3B:
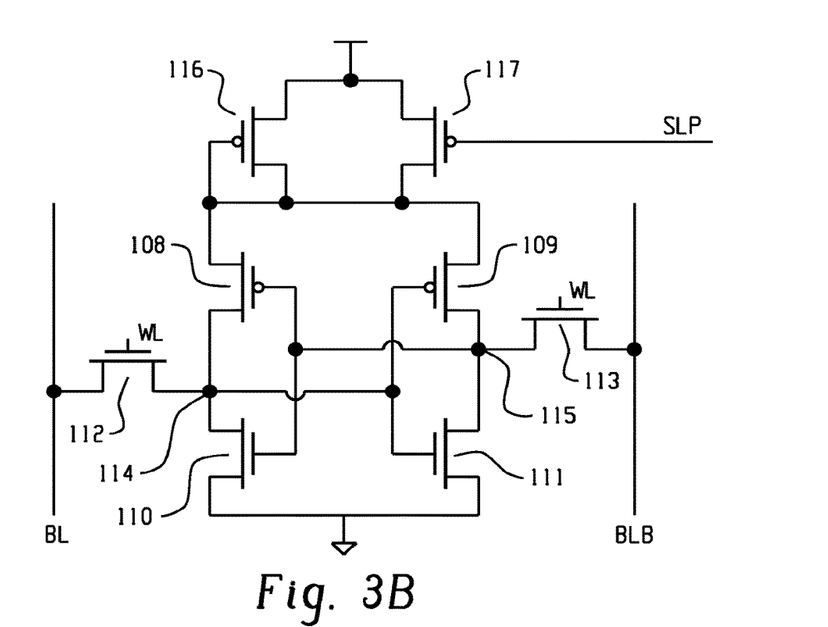

Depicted at FIGS. 3A and 3B are schematic diagrams of example SRAM memory cells that could be included in the example memory array layers 102, 104. FIG. 3A depicts a schematic diagram of a 6 T SRAM memory cell that includes cross-coupled p-MOS transistors 108, 109 and cross-couple n-MOS transistors 110, 111. The example memory cell also includes pass transistors 112, 113 for selectively coupling storage nodes 114, 115, respectively to the complementary bit line pair (BL, BLB).

FIG. 3B depicts a schematic diagram of an 8 T SRAM memory cell. Like the 6 T SRAM memory cell of FIG. 3A, the 8 T SRAM includes cross-coupled p-MOS transistors 108, 109 and cross-couple n-MOS transistors 110, 111. The example 8 T memory cell also includes pass transistors 112, 113 for selectively coupling storage nodes 114, 115, respectively to the complementary bit line pair (BL, BLB). The example 8 T memory cell also includes p-MOS transistors 116, 117 coupled between the power source and the cross-coupled p-MOS transistors 108, 109 for allowing the memory cell to operate in a reduced power Sleep or data retention mode. When the sleep (SLP) or data retention signal is inactive, such as when the memory cell is active for read or write operations, p-MOS transistors 117 is turned on and provides a charging path for cross-coupled p-MOS transistors 108, 109. When the sleep (SLP) signal is active, such as when the memory cell is inactive because other memory cells have been selected for read or write operations, p-MOS transistors 117 is turned off and diode connected p-MOS transistor 116 provides a charging path from the power source for cross-coupled p-MOS transistors 108, 109 at a reduced voltage level. Although the example memory cells of FIGS. 3A and 3B are provided, other types of SRAM memory cells may be used in the memory array layers 102, 104. Also other types of data retention circuitry could be used with a memory cell.

Referring back to FIG. 2, the memory array layers 102, 104 also include a plurality of word lines 118 disposed thereon. Each word line 118 is connected to a predetermined number of the memory cells and can be used by the pass gates in those memory cells to determine when to selectively coupling memory cell storage nodes to memory cell's associated complementary bit line pair. In this example, the word lines run generally parallel to the direction of a first axis 119 and generally perpendicular to a second axis 121. The number of cells for the layer in the direction of the first axis is equal to the number of I/O lines in the SRAM structure and the number of cells in the direction of the second axis is equal to the number of word line drivers per multiplexer in the SRAM structure.

The example 3D SRAM structure 100 also includes a layer decoder configured to decode a portion of an SRAM address supplied to the SRAM to determine the memory array layer on which the memory cells addressed by the SRAM address is disposed. The example layer decoder comprises a layer decoder circuit 120, 122 disposed on each memory array layer. Each layer decoder circuit 120, 122 is configured to decode a portion of the SRAM address to determine if the SRAM address corresponds to memory cells on its memory array layer. The layer decoder in some embodiments takes the place of a y-decoder in conventional SRAM devices. Additionally, in some embodiments, the layer decoder circuit on each memory array layer is configured to send a data retention signal (SLP) 123, 125 to each memory cell in its layer if the decoded SRAM address does not correspond to memory cells on its memory array layer.

The example 3D SRAM structure 100 also includes a word line driver configured to operate cooperatively with a partial SRAM address decoder (not shown) and the layer decoder to select and drive one of the plurality of word lines disposed on one of the memory array layers. The example word line driver comprises a word line driver circuit 124, 126 disposed on each memory array layer. Each word line driver circuit 124, 126 is configured to drive one of the plurality of word lines 118 disposed on its memory array layer. Additionally, each word line driver circuit is configured to drive one of the plurality of word lines disposed on its memory array layer when the layer decoder circuit disposed on its memory array layer determines that the SRAM address corresponds to memory cells on its memory array layer and the partial SRAM address decoder selects a word line on the same memory array layer.

In this example, the partial SRAM address decoder comprises a decoder circuit disposed on each memory array layer and each decoder circuit is configured to decode a portion of the SRAM address to select the one of the plurality of word lines disposed on its memory array layer corresponding to the portion of the SRAM address. The partial SRAM address decoder may be equivalent to a conventional SRAM x-decoder that selects a group of memory cells coupled to a common word line. In operation, memory cell selection by the layer decoder and the partial SRAM address decoder can allow the SRAM to perform a row read operation or a row write operation.

The use of the partial SRAM address decoder and the layer decoder may allow the SRAM structure to activate only the word line connected to those memory cells selected by the SRAM address so that a read operation or a write operation does not result in a non-selected memory cell consuming unnecessary power. In many embodiments, lower power consumption may be achieved because the half-selected mode of operation for unselected memory cells may be eliminated.

The example 3D SRAM structure 100 also includes a plurality of complementary bit line pairs 128, 129. Each complementary bit line pair 128, 129 extends vertically to couple to a memory cell in each memory array layer. Although not shown completely in the figure, each memory cell in a memory array layer has a unique bit line pair to which it can couple and those bit line pairs couple to a single memory cell in each additional memory array layer. The number of bit line pairs is equal to the number of I/O lines times the number of word line drivers per multiplexer.

The example 3D SRAM structure 100 also includes input/output (I/O) circuitry 130 and control circuitry 132. In this example, the I/O circuitry 130 and control circuitry 132 are disposed in a semiconductor layer below the memory array layers. Alternatively, the I/O circuitry 130 and/or control circuitry 132 can be disposed in a semiconductor layer above one or more of the memory array layers.

Figure 4:
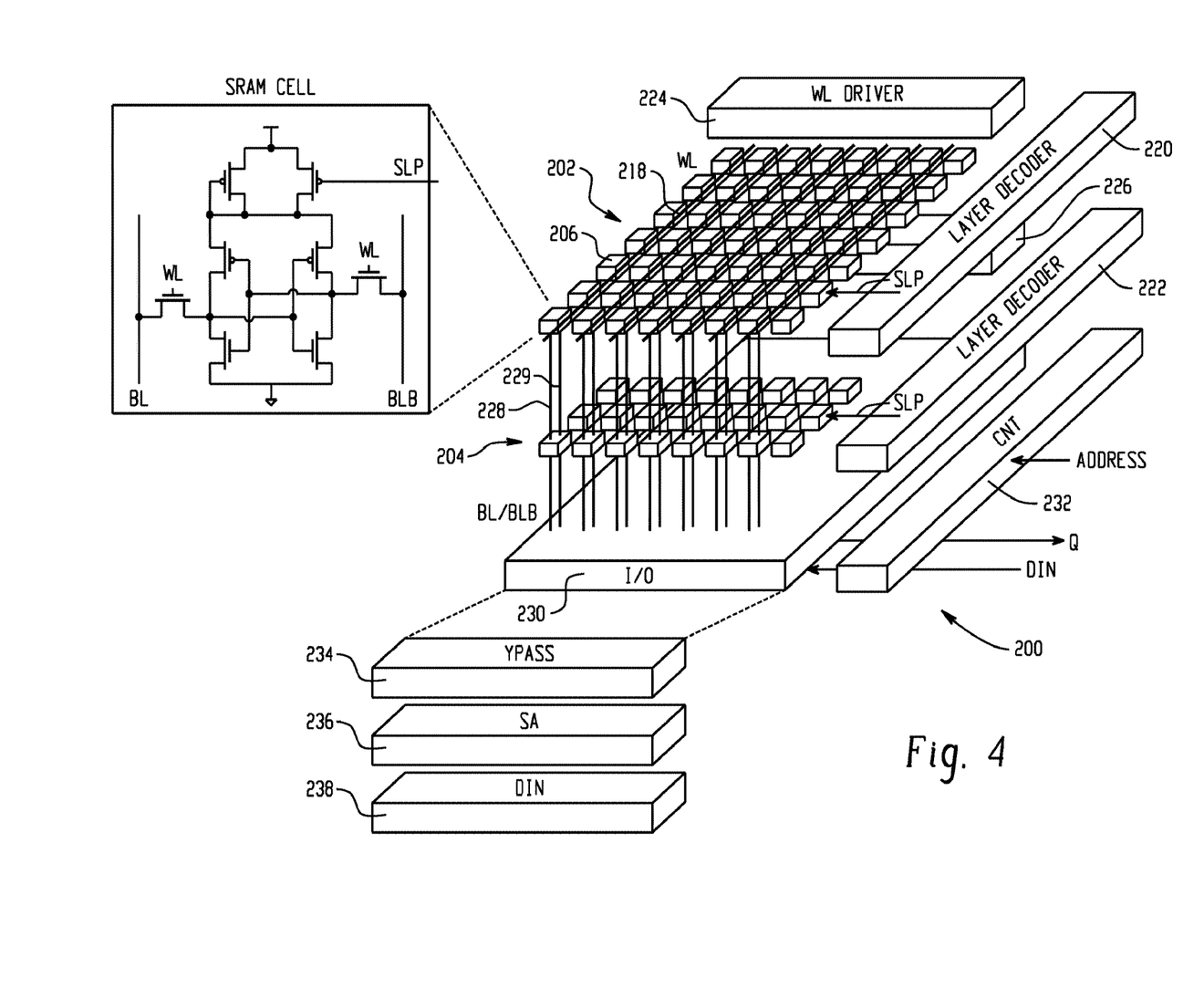
FIG. 4 is a block diagram of an example three dimension (3D) static random access memory (SRAM) structure illustrating that I/O circuitry can be separated into multiple parts and each part of the I/O circuitry disposed in a separate semiconductor layer above or below one or more of the memory array layers.

Depicted in FIG. 4 is a block diagram of another example three dimension (3D) static random access memory (SRAM) structure 200. The SRAM structure 200 is similar to the SRAM structure 100. The SRAM structure 200 also comprises a plurality of memory array layers 202, 204 vertically disposed one above another. Each memory array layer comprises a plurality of memory cells 206 and a plurality of word lines 208 disposed thereon, wherein each word line is connected to a predetermined number of the memory cells in a specific memory array layer. The SRAM structure 200 further comprises a layer decoder 220, 222 configured to decode a portion of an SRAM address to determine the memory array layer on which the memory cells addressed by the SRAM address is disposed and a word line driver 224, 226 configured to operate cooperatively with a partial SRAM address decoder (not shown) and the layer decoder 220, 222 to select and drive one of the plurality of word lines disposed on one of the memory array layers. Additionally, the SRAM structure 200 comprises a plurality of complementary bit line pairs 228, 229 wherein each complementary bit line pair extends vertically to couple to a memory cell in each memory array layer. The SRAM structure 200 is also configured to activate only the word line connected to those memory cells selected by the SRAM address so that a read or write operation does not result in a non-selected memory cell consuming unnecessary power.

The example 3D SRAM structure 200 also includes input/output (I/O) circuitry 230 and control circuitry 232. FIG. 4 illustrates that I/O circuitry 230 can be separated into multiple parts and each part of the I/O circuitry disposed in a separate semiconductor layer above or below one or more of the memory array layers. In this example, separate parts of the I/O circuitry 230, such as the YPASS circuitry 234, the sense amplifier circuitry 236, and the data in circuitry 238 are disposed in separate layers below the memory array layers. Also, control circuitry 232 can be disposed in a semiconductor layer above or below one or more of the memory array layers.

Figure 5:
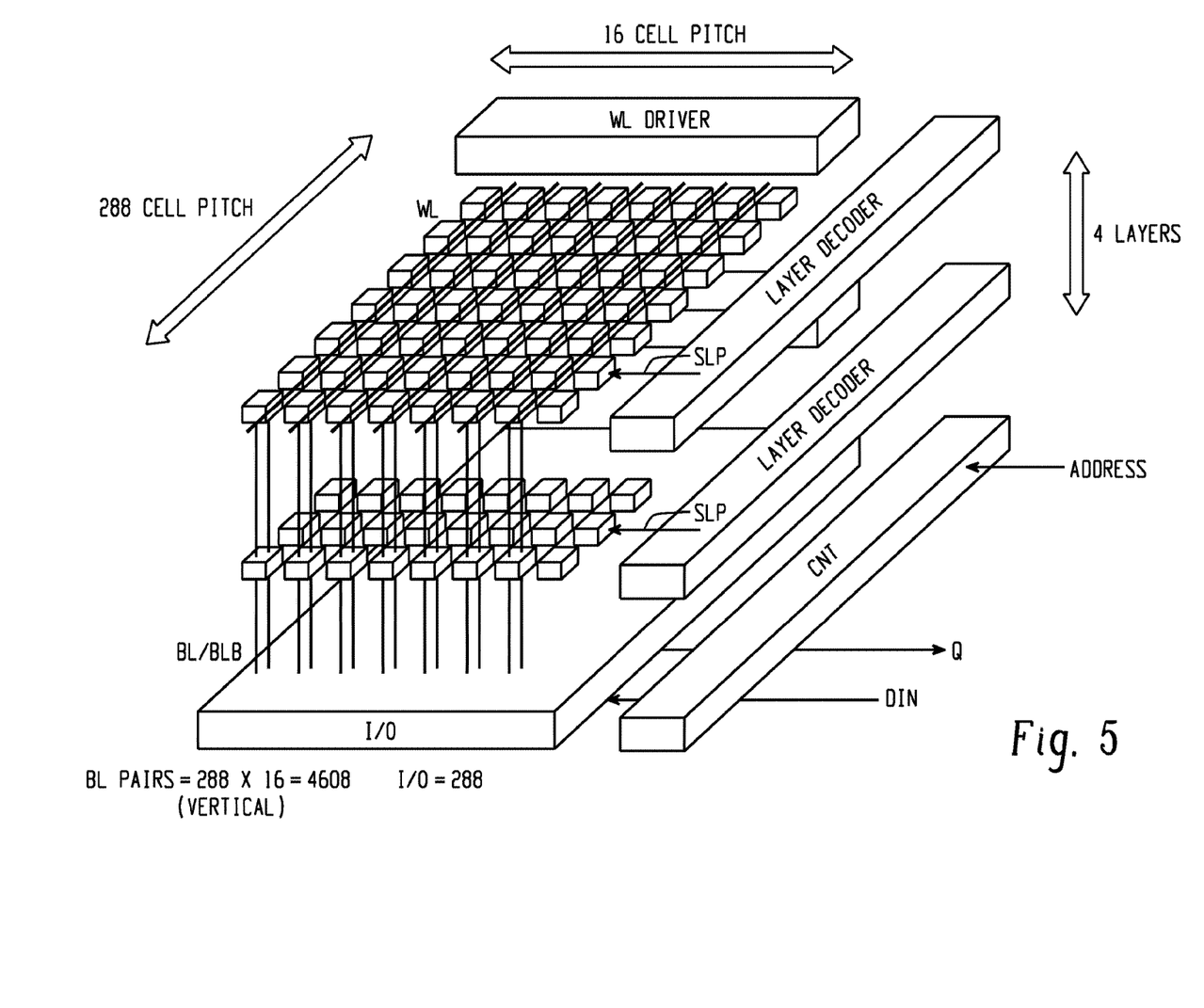
FIG. 5 is a block diagram of an example implementation of a 64×288M4 3D SRAM structure.

Depicted in FIG. 5 is a block diagram of an example implementation of a 64×288M4 3D SRAM structure 300. The SRAM structure 300 is similar to the SRAM structure 100. The SRAM structure 300 also comprises a plurality of memory array layers vertically disposed one above another. In this example implementation there are four memory array layers because this is an example implementation of a MUX 4 SRAM. The number of cells in the first axis for each memory array layer is 288 because the 64×288M4 SRAM has 288 I/O lines. The number of cells in the second axis for each memory array layer is 16 (i.e., 64/4) because the word line depth in the 64×288M4 SRAM is 64 and the number of multiplexers is 4. The number of bit line pairs is 4608 because there are 4608 (288×16) cells in each layer.

Figure 6:
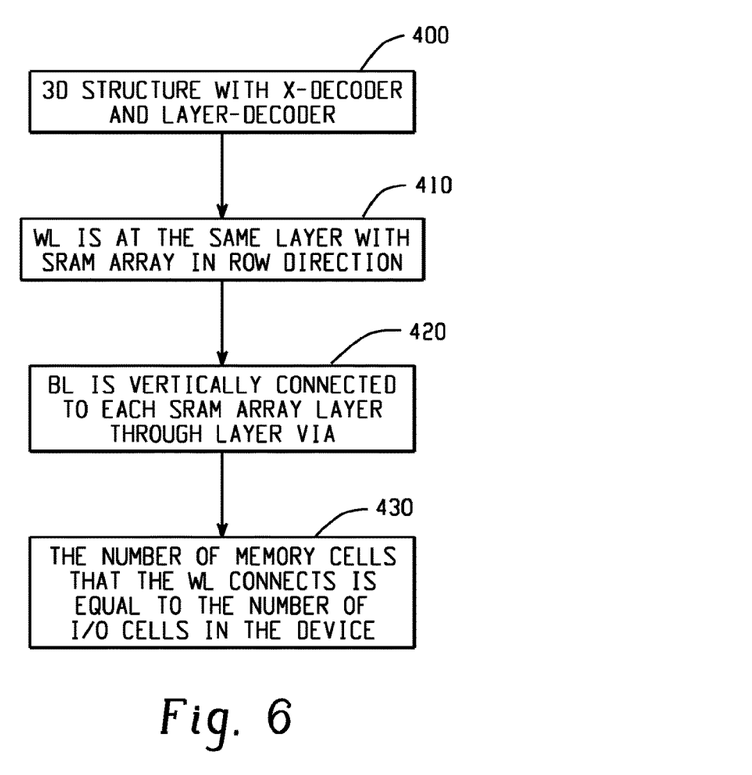
FIG. 6 is a flow diagram illustrating features of a three dimension (3D) static random access memory (SRAM) structure.

Depicted in FIG. 6 is a diagram illustrating features of an example three dimension (3D) static random access memory (SRAM) structure. At operation 400, the diagram illustrates that this example 3D SRAM includes an x-decoder and a layer-decoder. This example 3D SRAM does not include an x-decoder and y-decoder as in some 2D SRAMs. At operation 410, the diagram illustrates that each word line (WL) in the example 3D SRAM is on the same layer as the memory cells to which it connects and is in a row direction in the associated memory array layer. At operation 420, the diagram illustrates that each bit line (BL) in the example 3D SRAM connects to a memory cell in each layer through a layer via. At operation 430, the diagram illustrates that the number of memory cells that the WL connects is equal to the number of I/O cells in the device.

This written description uses examples to disclose the patentable scope of the described subject matter, including the best mode, and also to enable a person of ordinary skill in the art to make and use the patentable scope of the described subject matter. The patentable s cop e includes other examples.

In one example, provided is a SRAM structure comprising a plurality of memory array layers, layer decoder circuitry on each memory array layer, a word line driver circuit disposed on each memory array layer, and a plurality of complementary bit line pairs extending vertically from a memory cell in a first memory array layer to a memory cell in a second memory array layer. The memory array layers comprise at least a first memory array layer and a second memory array layer vertically disposed above the first memory array layer. Each memory array layer comprises a plurality of memory cells. The layer decoder circuitry on each memory array layer comprises a first layer decoder circuit on the first memory array layer and a second layer decoder circuit on the second memory array layer. Each of the first layer decoder circuit and the second layer decoder circuit is configured to decode a portion of an SRAM address to determine if the SRAM address corresponds to memory cells on its memory array layer. The word line driver circuit disposed on each memory array layer is configured to operate cooperatively with a partial SRAM address decoder to select and drive one of the plurality of word lines disposed on its memory array layer, wherein a selected word line is connected to a predetermined number of memory cells in a specific memory array layer.

In another example, provided is a SRAM structure comprising a plurality of memory array layers vertically disposed one above another, a layer decoder circuit on each memory array layer, a word line driver configured to operate cooperatively with a partial SRAM address decoder and one of the layer decoder circuits to select and drive one of the plurality of word lines disposed on one of the memory array layers, and a plurality of complementary bit line pairs, each complementary bit line pair extending vertically to couple to a memory cell in each memory array layer. Each memory array layer comprises a plurality of memory cells and a plurality of word lines disposed thereon. Each word line is connected to a predetermined number of the memory cells in a specific memory array layer. Each layer decoder circuit is configured to decode a portion of an SRAM address to determine if the SRAM address corresponds to memory cells on its memory array layer. The SRAM device is configured to activate only the word line connected to those memory cells selected by the SRAM address so that a read or write operation does not result in a non-selected memory cell consuming unnecessary power.

In another example, a method in a SRAM is provided comprising providing a plurality of memory array layers vertically disposed one above another. Each memory array layer comprises a plurality of memory cells. Each memory array layer further comprises an x-decoder and a layer decoder. The layer decoder is configured to decode a portion of an SRAM address to determine the memory array layer on which the memory cells addressed by the SRAM address are disposed. The method further comprises providing a plurality of word lines disposed on each memory array layer, wherein each word line is connected to a predetermined number of the memory cells in a specific memory array layer in a row direction. The method additionally comprises providing a plurality of complementary bit line pairs, each complementary bit line pair extending vertically to couple to a memory cell in each memory array layer. In addition, the predetermined number of memory cells that the word lines connect is equal to the number of input/output cells in the device.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A memory device comprising:
   a first memory array disposed in a first memory array layer;
   a second memory array disposed in a second memory array layer over the first memory array layer;
   a first memory layer decoder communicatively coupled to the first memory array, the first memory layer decoder being configured to decode a portion of a memory address to determine if the memory address corresponds to the first memory array;
   a second memory layer decoder communicatively coupled to the second memory array, the second memory layer decoder being configured to decode a portion of the memory address to determine if the memory address corresponds to the second memory array;
   a plurality of first word lines disposed on the first memory array layer;
   a plurality of second word lines disposed on the second memory array layer;
   a first word line driver circuit communicatively coupled to the first memory array, the first word line driver circuit of the first memory array being configured to drive one of the plurality of first word lines disposed on the first memory array layer, wherein only one word line coupled to the first memory array is selected at a time;
   a second word line driver circuit communicatively coupled to the second memory array, the second word line driver circuit of the second memory array being configured to drive one of the plurality of second word lines disposed on the second memory array layer, wherein only one word line coupled to the second memory array is selected at a time; and
   a first bit line coupled to a single memory cell in the first memory array layer and a single memory cell in the second memory array layer.

2. The memory device of claim 1, wherein the first memory layer decoder is configured to send a data retention signal to each memory cell in the first memory array if the decoded memory address does not correspond to memory cells on the first memory array.

3. The memory device of claim 2, wherein each memory cell of the first memory array comprises a data retention circuitry that allows the memory cells to operate in a reduced power when the data retention circuitry receives the data retention signal.

4. The memory device of claim 1, further comprising a partial address decoder, the word first line driver circuit is configured to operate cooperatively with the partial address decoder and the first memory layer decoder to select and drive one of the plurality of first word lines communicatively coupled to the first memory array.

5. The memory device of claim 1, further comprising a second bit line coupled to the single memory cell in the first memory array and the single memory cell in the second memory array layer, the first bit line and the second bit line being complementary bit lines.

6. The memory device of claim 1, further comprising input/output circuitry.

7. The memory device of claim 6, wherein the input/output circuitry is below a lowest memory array.

8. The memory device of claim 6, wherein the input/output circuitry is above an uppermost memory array.

9. A memory device comprising:
a plurality of memory array layers vertically disposed one above another, each memory array layer comprising a plurality of memory cells and a plurality of word lines disposed thereon;
a layer decoder circuit on each memory array layer, each layer decoder circuit being configured to receive and decode an address to determine if the address corresponds to memory cells on the corresponding memory array layer, wherein each the layer decoder circuit is configured such that only one layer decoder circuit will determine the address corresponds to memory cells on the corresponding memory array layer; and
a word line driver on each memory array layer, each word line driver configured to drive one of the plurality of word lines on the corresponding memory array layer, wherein power is selectively applied to only one word line of the plurality of word lines coupled to the corresponding memory array layer during a row read or row write operation.

10. The memory device of claim 9, further comprising a plurality of complementary bit line pairs, each complementary bit pair lines being coupled to a single memory cell on each of the plurality of memory array layers.

11. The memory device of claim 9, wherein the layer decoder circuit on each memory array layer is configured to send a data retention signal to each memory cell in a corresponding memory array layer when the decoded address does not apply to the corresponding memory array layer.

12. The memory device of claim 9, further comprising a plurality of complementary bit line pairs, each memory cell in a first memory array layer being coupled to a different pair of the plurality of complementary bit line pairs.

13. The memory device of claim 9, further comprising a sense amplifier in a layer free of the plurality of memory array layers.

14. The memory device of claim 13, further comprising a YPASS circuitry in a layer free of the plurality of memory array layers and the sense amplifier.

15. The memory device of claim 14, further comprising a data-in circuitry in a layer free of the plurality of memory array layers, the sense amplifier, and the YPASS circuitry.

16. The memory device of claim 9, further comprising a sense amplifier, a YPASS circuitry, and a data-in circuitry in a layer free of the plurality of memory array layers.

17. A memory device comprising:
a first memory array of stacked memory arrays disposed in a first memory array layer;
a second memory array of the stacked memory arrays disposed in a second memory array layer over the first memory array layer;
a first memory layer decoder communicatively coupled to the first memory array, the first memory layer decoder being configured to decode a memory address to determine if the memory address corresponds to the first memory array, the first memory layer decoder being configured to set a first memory array layer data retention signal when the memory address corresponds to another memory layer;
a second memory layer decoder communicatively coupled to the second memory array, the second memory layer decoder being configured to decode the memory address to determine if the memory address corresponds to the second memory array, the second memory layer decoder being configured to set a second memory layer data retention signal when the memory address corresponds to another memory layer;
a plurality of first word lines disposed on the first memory array layer;
a plurality of second word lines disposed on the second memory array layer;
a first word line driver circuit communicatively coupled to the first memory array, the first word line driver circuit being configured to drive only one of the plurality of first word lines disposed on the first memory array layer;
a second word line driver circuit communicatively coupled to the second memory array, the second word line driver circuit being configured to drive only one of the plurality of second word lines disposed on the second memory array layer; and
a bit line coupled to the first memory array layer and the second memory array layer.

18. The memory device of claim 17, further comprising control circuitry, the control circuitry being disposed in a layer different than the stacked memory arrays, the control circuitry receiving a data-in signal and an address signal.

19. The memory device of claim 18, further comprising input/output circuitry, the input/output circuitry being disposed in one or more layers different than the stacked memory arrays.

20. The memory device of claim 19, wherein the input/output circuitry comprises a sense amplifier, a YPASS circuitry, and a data-in circuitry.

* * * * *